United States Patent
Shifren et al.

(10) Patent No.: US 10,056,143 B2
(45) Date of Patent: Aug. 21, 2018

(54) CORRELATED ELECTRON SWITCH PROGRAMMABLE FABRIC

(71) Applicant: ARM Ltd., Cambridge (GB)

(72) Inventors: Lucian Shifren, San Jose, CA (US); Greg Yeric, Austin, TX (US); Saurabh Sinha, Austin, TX (US); Brian Cline, Austin, TX (US); Vikas Chandra, San Jose, CA (US)

(73) Assignee: ARM Ltd., Cambridge (GB)

(*) Notice: Subject to any disclaimer, the term of this patent is extended or adjusted under 35 U.S.C. 154(b) by 0 days.

(21) Appl. No.: 14/848,129

(22) Filed: Sep. 8, 2015

(65) Prior Publication Data

US 2017/0069378 A1 Mar. 9, 2017

(51) Int. Cl.
| G11C 11/00 | (2006.01) |
| G11C 13/00 | (2006.01) |
| H01L 27/24 | (2006.01) |
| H01L 45/00 | (2006.01) |

(52) U.S. Cl.
CPC ........ *G11C 13/0069* (2013.01); *G11C 13/004* (2013.01); *H01L 27/2409* (2013.01); *H01L 27/2481* (2013.01); *H01L 27/2436* (2013.01); *H01L 45/04* (2013.01); *H01L 45/1233* (2013.01); *H01L 45/14* (2013.01); *H01L 45/146* (2013.01); *H01L 45/147* (2013.01)

(58) Field of Classification Search
None
See application file for complete search history.

(56) References Cited

U.S. PATENT DOCUMENTS

| 7,298,640 B2 | 11/2007 | Chen et al. |
| 7,639,523 B2 | 12/2009 | Celinska et al. |
| 7,778,063 B2 | 8/2010 | Brubaker et al. |
| 7,872,900 B2 | 1/2011 | Paz de Araujo et al. |
| 8,816,719 B2 | 8/2014 | McWilliams et al. |
| 2005/0236691 A1 | 10/2005 | Shimada |
| 2008/0106926 A1* | 5/2008 | Brubaker ............ H01L 27/2409 365/148 |
| 2008/0107801 A1 | 5/2008 | Celinska et al. |
| 2011/0127483 A1* | 6/2011 | Sonehara ............ G11C 13/0002 257/2 |
| 2013/0285699 A1 | 10/2013 | McWilliams et al. |
| 2014/0104925 A1* | 4/2014 | Azuma ................ G11C 13/004 365/148 |
| 2016/0284399 A1* | 9/2016 | Mantegazza ........ G11C 13/004 |

OTHER PUBLICATIONS

Stefanovich et al. "Electrical switching and Mott transition in VO$_2$", J. Phys.: Condens. Matter 12 (2000), 9 pages.
PCT/GB2016/052760: International Search Report and Written Opinion, dated Dec. 5, 2016.
PCT/GB2016/052760: Application as filed Sep. 7, 2016, 53 pages.
PCT/GB2016/052760 / 252.P006PCT: IPRP, dated Mar. 22, 2018, 8 pages.

* cited by examiner

*Primary Examiner* — Uyen B Tran
(74) *Attorney, Agent, or Firm* — Berkeley Law & Technology Group, LLP

(57) ABSTRACT

Subject matter disclosed herein may relate to programmable fabrics including correlated electron switch devices.

14 Claims, 12 Drawing Sheets

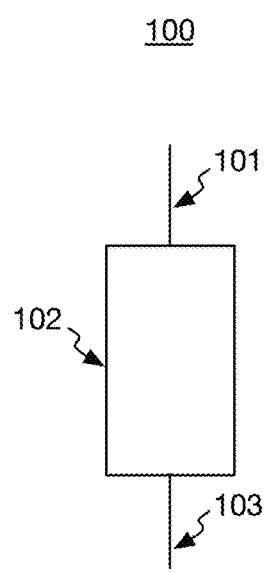
FIG. 1a
FIG. 1b

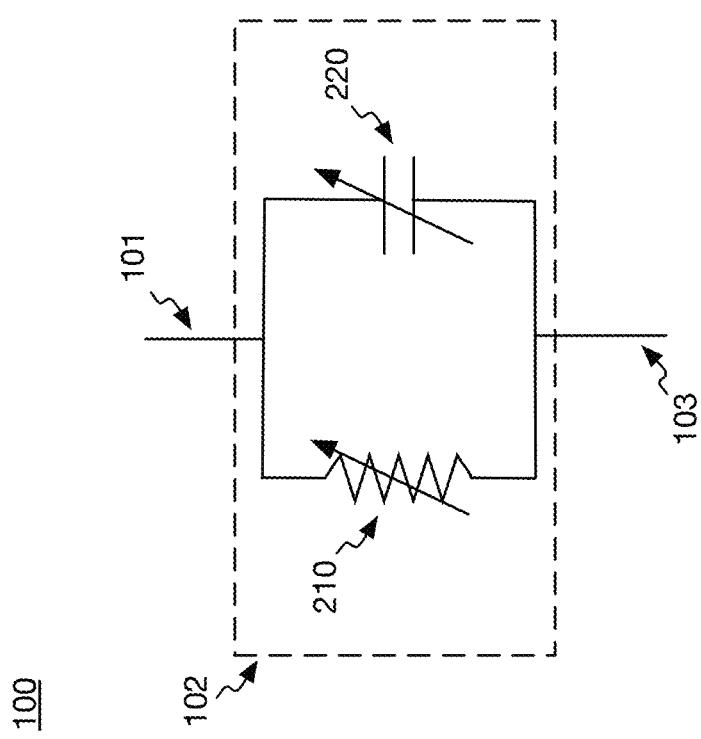

CORRELATED ELECTRON SWITCH PROGRAMMABLE FABRIC

BACKGROUND

Field

Subject matter disclosed herein may relate to correlated electron switch devices, and may relate more particularly to programmable fabrics including correlated electron switch devices.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory and/or logic devices, that may be of interest to a designer in considering suitability for any particular application may include physical size, storage density, operating voltages, and/or power consumption, for example. Other example factors that may be of interest to designers may include cost of manufacture, ease of manufacture, scalability, and/or reliability. Also, there appears to be an ever increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 1a shows block diagram of an example embodiment of a correlated electron switch device comprising a correlated electron material, in accordance with an embodiment.

FIG. 1b depicts an example symbol for a correlated electron switch.

FIG. 2 is a schematic diagram of an equivalent circuit of a correlated electron switch, in accordance with an embodiment.

Figure 3:
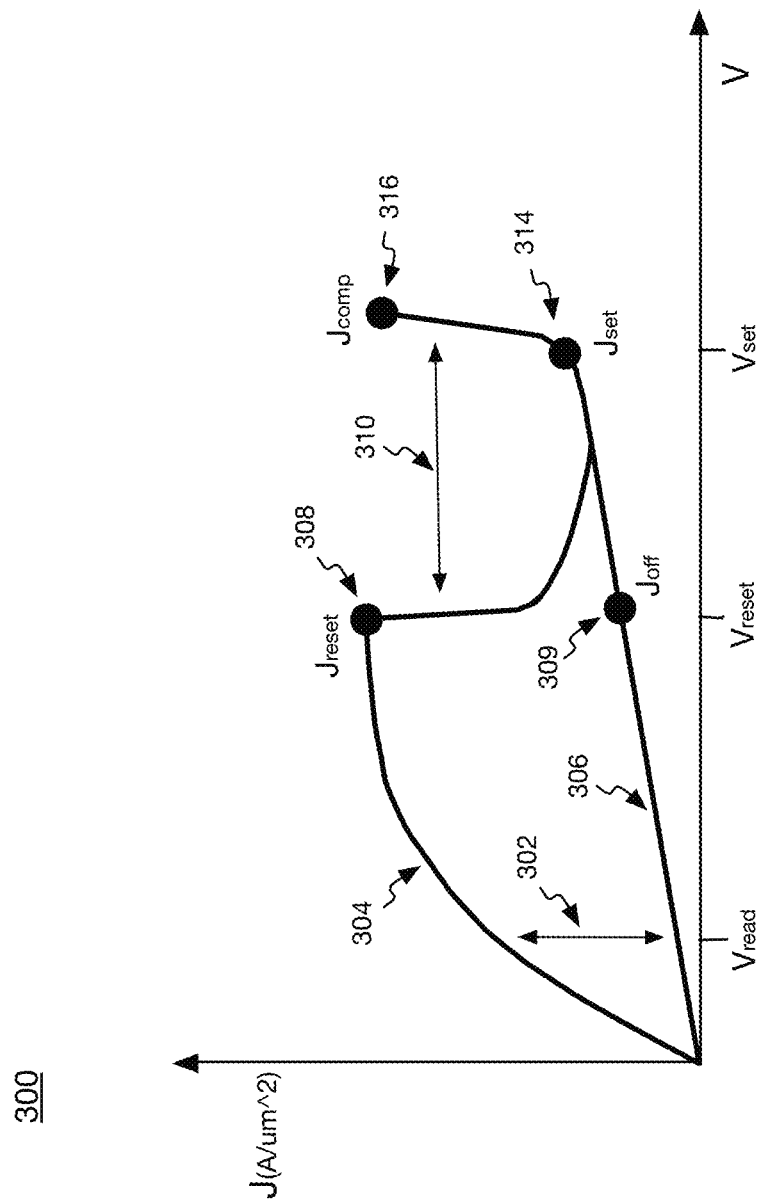
FIG. 3 shows a plot of current density versus voltage for a correlated electron switch, in according to an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure incorporate correlated electron material (CEM) to form a correlated electron switch (CES), such as, for example, in memory and/or logic devices. CES devices may also be utilized in a wide range of other electronic circuit types, such as, for example, filter circuits, data converters, phase locked loop circuits, and high-speed transceivers, although the scope of claimed subject matter is not limited in scope in these respects. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_c)1^{/3}$ a≈0.26, where $n_c$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, in an embodiment, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an aspect.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an aspect, a CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

FIG. 1a shows an example embodiment 100 of a CES device comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned, CEM, such as material 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as CES device 100, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

FIG. 2 depicts a schematic diagram of an equivalent circuit of an example CES/variable impeder device, such as CES device 100. As mentioned, a CES/variable impeder device may comprise characteristics of both variable resistance and variable capacitance. That is, the impedance characteristics for a CES/variable impeder device, such as CES device 100, may depend at least in part on the resistance and capacitance characteristics of the device. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as CES 100, may comprise a substantially homogenous CEM, such as CEM 102, wherein the CEM comprises characteristics of variable capacitance and variable resistance.

Table 1 below depicts an example truth table for an example variable impeder device, such as CES device 100.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, example truth table 120 shows that a resistance of a variable impeder device, such as CES device 100, may transition between a lower resistance state and a higher resistance state that is a function, at least in part, of a voltage applied across the CEM. In an embodiment, a resistance of a lower resistance state may be 10-100,000 times lower than a resistance of a higher resistance state, although claimed subject matter is not limited in scope in this respect. Similarly, example truth table 120 shows that a capacitance of a variable impeder device, such as CES device 100, may transition between a lower capacitance state, which for an example embodiment may comprise approximately zero, or very little, capacitance, and a higher capacitance state that is a function, at least in part, of a voltage applied across the CEM. Also, as seen in Table 1, a variable impeder device transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 100, is not a resistor, but rather comprises a device having properties of both variable capacitance and variable resistance. In an embodiment, resistance and/or capacitance values, and therefore impedance values, depend, at least in part, on an applied voltage.

FIG. 3 shows a plot of current density versus voltage across electrically conductive terminals, such as electrically conductive terminals 101 and 103, for a CES device, such as example CES device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the CES device in an insulative/higher impedance state, and application of a voltage $V_{set}$ and a current density $J_{set}$ may place the CES device in a conductive/lower impedance state. That is, a "set" condition may place a variable impeder device, such as CES device 100, into a conductive/lower impedance state, and a "reset" condition may place a variable impeder device, such as CES device 100, into an insulative/higher impedance state, in an embodiment. Following placement of the CES device in a lower impedance state or a higher impedance state, the particular state of the CES device may be detected at least in part by application of a voltage $V_{read}$ (e.g., in a read operation) and detection of a current or current density at terminals, such as electrically conductive terminals 101 and 103, of a variable impeder device, such as CES device 100.

In an embodiment, a CEM of a CES device may include, for example, any TMO, such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from the scope of claimed subject matter.

In one aspect, the CES device of FIG. 1 may comprise materials that comprise TMO metal oxide variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

In an embodiment, CES devices may be initially manufactured in a conductive/lower impedance state. Also, in an embodiment, CES devices may be non-volatile, in that CES devices may maintain respective impedance states until further programming is performed. For example, according to an embodiment, if sufficient bias is applied (e.g., exceeding a band-splitting potential) and the aforementioned Mott condition is met (injected electron holes=the electrons in the switching region), the CES device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the CES device is still in the insulative/higher impedance state, current may generated by transportation of holes. If enough bias is applied across terminals of the CES device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the CES device in a conductive/lower impedance state.

According to an embodiment, current in a CEM of a CES device may be controlled by an externally applied "compliance" condition determined based, at least in part, on the external current limited during a write operation to achieve a set condition to place the CES device in a conductive/lower impedance state. This externally applied compliance current also sets the subsequent reset condition current density requirement. As shown in the particular implementation of FIG. 3, a current density $J_{comp}$ applied during a write operation at point 316 to place the CES device in a conductive/lower impedance state may determine a compliance condition for placing the CES in an insulative/higher impedance state in a subsequent write operation. As shown, the CEM of the CES device may be subsequently placed in an insulative/higher impedance state by application of a current density $J_{reset} \geq J_{comp}$ at a voltage $V_{reset}$ at point 308, wherein $J_{comp}$ may be externally applied, in an embodiment.

A compliance current, such as an externally applied compliance current, therefore may set a number of electrons in a CEM of a CES device which are to be "captured" by holes for the Mott transition. In other words, a current applied in a write operation to place a CES device in a conductive/lower impedance state may determine a number of holes to be injected to the CEM of the CES device for subsequently transitioning the CES device to an insulative/higher impedance state. As discussed more fully below, a compliance current may be applied dynamically.

As pointed out above, a transition to an insulative/higher impedance state may occur in response to a Mott transition at point 308. As pointed out above, such a Mott transition may occur at a condition in a CEM of a CES device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \qquad (1)$$

$$n = \left(\frac{C}{\lambda_{TF}}\right)^3$$

where:

$\lambda_{TF}$ is a Thomas Fermi screening length; and

C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as CES device 100. Here, injection of holes may meet a Mott transition criterion for the conductive to insulator transition at current $I_{MI}$ as a critical voltage $V_{MI}$ is applied across terminals, such as terminal 101 and 103, of a variable impeder device, such as CES device 100. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ is the charge injected (hole or electron) and is a function of the applied voltage. As used herein, the notation "MI" signifies a metal-to-insulator transition, and the notation "IM" signifies an insulator-metal transition. That is, "$V_{MI}$" refers to a critical voltage and "$I_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

Wherein $A_{CEM}$ is a cross-sectional area of a CEM, such as CEM 102, of a variable impeder device, such as CES device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the CES device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as CES device 100, may be placed in a conductive/lower impedance state (e.g., by transitioning from an insulative/higher impedance state) by injection of a sufficient number of electrons to satisfy a Mott transition criteria.

In transitioning a CEM of a CES device to a conductive/lower impedance state, as enough electrons have been injected and the potential across terminals of the variable impeder device overcomes a critical switching potential (e.g., $V_{set}$); injected electrons begin to screen and unlocalize double-occupied electrons to reverse a disproportion reaction and closing the bandgap. A current density $J_{set}(V_{MI})$, depicted at point 314 of FIG. 3, for transitioning the CEM of the CES device to the conductive/lower impedance state in a metal-insulator Mott transition at a critical voltage $V_{MI}$ enabling transition to the conductive/lower impedance state may be represented according to expressions (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{IM}) = J_{injection}(V_{IM}) = J_{IM}(V_{IM}) = \frac{I_M(V_{IM})}{A_{CEM}} = \frac{q}{A_{CEM}t}\left(\frac{C}{a_B}\right)^3$$

where:
$a_B$ is a Bohr radius.

According to an embodiment, a "read window" 302 for detecting a memory state of a CES device in a read operation may be set out as a difference between a portion 306 the plot of FIG. 3 while the CEM of the CES device is in an insulative/higher impedance state and a portion 304 of the plot FIG. 3 while the CEM of the CES device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as CES device 100. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

wherein $J_{off}$ represents a current density of a CEM in an insulative/higher impedance state at $V_{reset}$. See, for example, point 309 of FIG. 3.

In another embodiment, a "write window" 310 for placing a CEM of CES device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the CES device.

In an embodiment, a process for reading a value represented as an impedance state of a variable impeder device, such as CES device 100, may comprise a voltage being applied to a CEM of a CES device. At least one of a current and/or current density within a CEM of a CES device may be measured, and an impedance state of a CEM of a CES device may be determined, at least in part, on the measured current and/or current density, in an embodiment.

Additionally, in an embodiment, an impedance of an impedance state may depend at least in part on a combination of a capacitance and a resistance of a CEM of a CES device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the CES device. In an embodiment, the physical property of the CEM of the CES device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a CES device such that the CES enters a first impedance state. A plurality of holes may be provided to the CEM such that the CES enters a second impedance state. Also, in an embodiment, the plurality of electrons may cause a voltage across the CES to be greater than a set voltage threshold, and the plurality of holes may cause the voltage across the CES to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a CES device may be exceeded. Additionally, a reset voltage across a CEM and a reset current density through a CEM of a CES device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a CES device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

As mentioned above, a CES device, also referred to as a variable impeder device, such as variable impeder device 100, may be implemented in a wide range of electronic device types. For example, a variable impeder device, such as variable impeder device 100, may be utilized in logic circuits, memory circuits, filter circuits, etc. Generally speaking, a variable impeder device, such as variable impeder device 100, may be utilized in any circuit or device, presently existing or to exist in the future, that may benefit from the variable impeder device's variable resistance and/or variable capacitance characteristics.

For example, in an embodiment, a CES device, such as variable impeder device 100, may be implemented in a memory cell, for example. In one or more embodiments, a CES memory may comprise: a variable impeder memory cell including a CES; a write circuit for placing the variable impeder memory cell in a first impedance state or a second impedance state depending on signals provided to the memory device; and a read circuit for sensing an impedance state of the memory cell and providing an electrical signal corresponding to the sensed state of the memory cell. In one aspect, an impedance of a CES in the second memory cell state may be significantly greater than the impedance in the first memory cell state.

Integrated circuits, such as example integrated circuits discussed herein, may include multiple layers of material that may be built on a substrate. Layers of material may include one or more electrically conductive layers, sometimes referred to as "metal" layers and/or "metallization" layers that may interconnect with circuit devices. As used herein, the terms "metal layer" and/or "metallization layer" refer to electrically conductive electrodes, otherwise referred to as "lines", that may be formed from an electrically conductive material. Example materials for a metallization layer may include, for example, aluminum and/or copper, to name but a couple of examples. Vias formed between metallization layers may also be formed of electrically conductive materials such as polysilicon, tungsten, copper, and/or aluminum, for example. Of course, claimed subject matter is not limited to these specific examples.

Also, as used herein, the term "substrate" may include silicon-on-insulator (SOI) or silicon-on-sapphire (SOS) technology, doped and/or undoped semiconductors, epitaxial layers of silicon supported by a base semiconductor foundation, conventional metal oxide semiconductors (CMOS), e.g., a CMOS front end with a metal backend, and/or other semiconductor structures and/or technologies, including CES devices, for example. Various circuitry, such as driver and/or decode circuitry, for example, associated with operating a programmable fabric and/or memory array may be formed in and/or on a substrate. Furthermore, when reference is made to a "substrate" in the following description, previous process steps may have been utilized to form regions and/or junctions in the base semiconductor structure or foundation.

In an embodiment, CES devices may be implemented in any of a wide range of integrated circuit types. For example, numerous CES devices may be implemented in an integrated circuit to form a programmable fabric that may be reconfigured by changing impedance states for one or more CES devices, in an embodiment. In another embodiment, a CES programmable fabric may be utilized as non-volatile memory array, for example. Of course, claimed subject matter is not limited in scope to the specific examples provided herein. As used herein, the term "fabric" as it relates to integrated circuits refers to an underlying structure of the integrated circuit. For example, in an embodiment, an integrated circuit "fabric" may include multiple metallization layers and/or one or more vias to provide electrical conductivity between metallization layers. A "programmable fabric" may refer to an integrated circuit fabric that is reconfigurable. For example, as described in connection with one or more example embodiments below, a programmable fabric may include one or more CES devices that may selectively provide lower impedance electrically conductive paths between metallization layers in an integrated circuit.

Additionally, in an embodiment, CES devices may be implemented in middle-of-line (MOL) and/or back-end-of-line (BEOL) processes for an integrated circuit. For example, because a CES device may be formed directly on a source and/or drain region of a transistor formed in an integrated circuit device, and because a CES device may also be directly coupled to an electrically conductive line of a metal layer, a CES device may serve as a sort of connector between a source and/or drain region and an electrically conductive line of a metal layer, for example. Thus, as may be seen in the examples that follow, CES devices may be implemented in any of a number of layers of an integrated circuit device, and may also be implemented in any of a wide range of configurations.

Figure 4C:
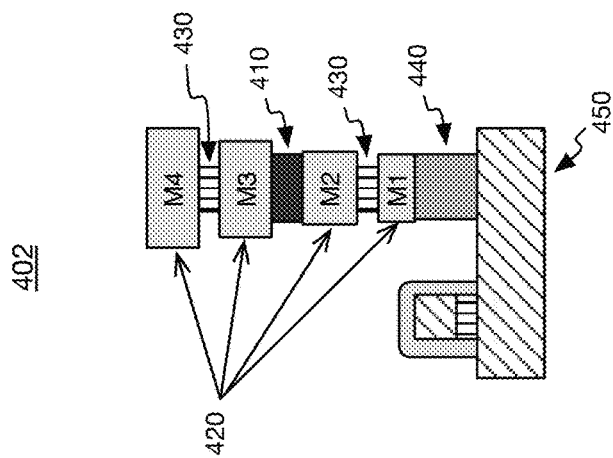
FIG. 4c is an illustration depicting a cross-sectional view of a portion of an example integrated circuit including a correlated electron switch, in accordance with an embodiment.
Figure 4B:
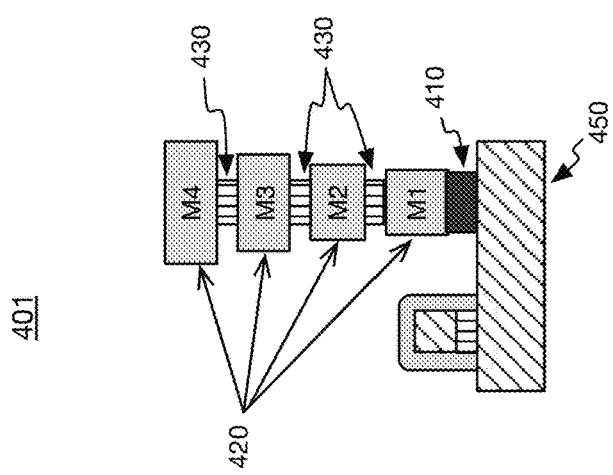
FIG. 4b is an illustration depicting a cross-sectional view of a portion of an example integrated circuit including a correlated electron switch, in accordance with an embodiment.
Figure 4A:
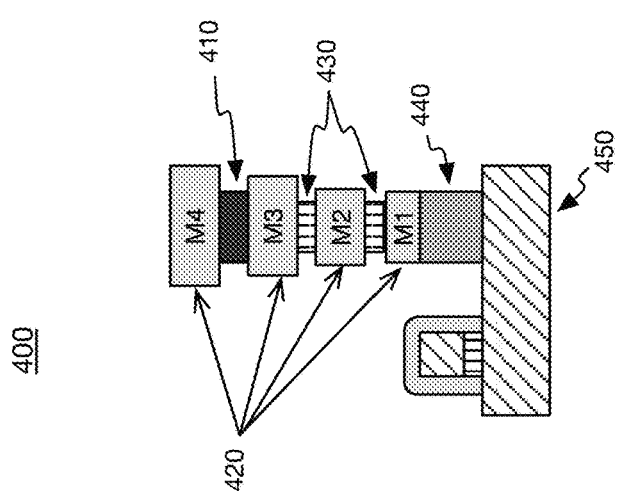
FIG. 4a is an illustration depicting a cross-sectional view of a portion of an example integrated circuit including a correlated electron switch, in accordance with an embodiment.

FIG. 4a is an illustration depicting a cross-sectional view of a portion of an example embodiment 400 of an integrated circuit. In an embodiment, an integrated circuit, such as integrated circuit 400, may comprise a substrate, such as substrate 450, that may include one or more transistors and/or other semiconductor structures formed therein, for example. Example integrated circuit 400 may also comprise a plurality of metallization layers 420, such as metal layers M1, M2, M3, and M4. A connector, such as connector 440, may couple a substrate, such as substrate 450, to a metallization layer 420, such as metal layer M1. Vias, such as vias 430, may electrically couple metal layer M1 to M2, and metal layer M2 to M3, for example.

Figure 4D:
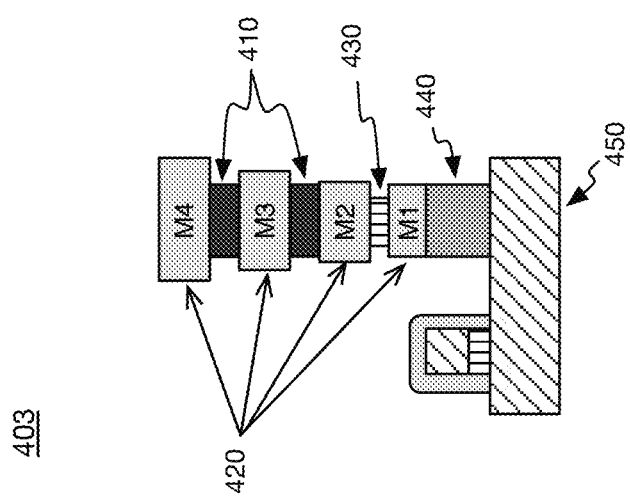
FIG. 4d is an illustration depicting a cross-sectional view of a portion of an example integrated circuit including a plurality of correlated electron switches, in accordance with an embodiment.

As also depicted in FIG. 4a, a CES device, such as CES 410, may be positioned between two metallization layers 420, such as between metal layers M3 and M4, for this example. Although the example depicted in FIG. 4a shows a CES device positioned at a particular level within integrated circuit 400, other embodiments may position CES devices at other levels of an integrated circuit. FIGS. 4b-4d, discussed below, depict other examples showing CES devices positioned at other layers within an integrated device.

FIG. 4b is an illustration depicting a cross-sectional view of a portion of an example embodiment 401 of an integrated circuit. Example integrated circuit 401 may have some elements in common with example integrated circuit 400, mentioned above. Example integrated circuit 401 differs from integrated circuit 400 in that a CES device, such as CES 410, is formed substantially directly on substrate 450, in essence serving as a connector between substrate 450 and metal layer M1. Example integrated circuit 401 may further include additional metallization layers 420, such as metal layers M2, M3, and M4, in an embodiment. Vias 430 may provide electrical conductivity between metallization layers, in an embodiment.

FIG. 4c depicts a cross-sectional view of a portion of an additional example embodiment 402 of an integrated circuit. Example integrated circuit 402 may have some elements in common with example integrated circuits 400 and 401, mentioned above, but may differ from those examples in that a CES device, such as CES 420, may be positioned between metal layers M2 and M3. Thus, as can be seen in FIGS. 4a-4c, CES devices, such as CES devices 410, may be implemented at any of various layers of an integrated circuit device. As discussed above, CES devices, such as CES 410, may be implemented in any layer in the MOL and/or in the BEOL of an integrated circuit device, in one or more embodiments.

Additionally, as depicted in FIG. 4d, CES devices, such as CES devices 410, may be implemented at more than a single layer within an integrated circuit device, such as integrated circuit device 403. For example, CES devices, such as CES devices 410, may be positioned between metal layers M2 and M3, and also between metal layers M3 and M4. However, it should be noted that claimed subject matter is not limited in scope to the particular examples described herein. CES devices, such as CES 410, may be implemented in any combination of one or more layers of an integrated circuit, in an embodiment.

Figure 5:
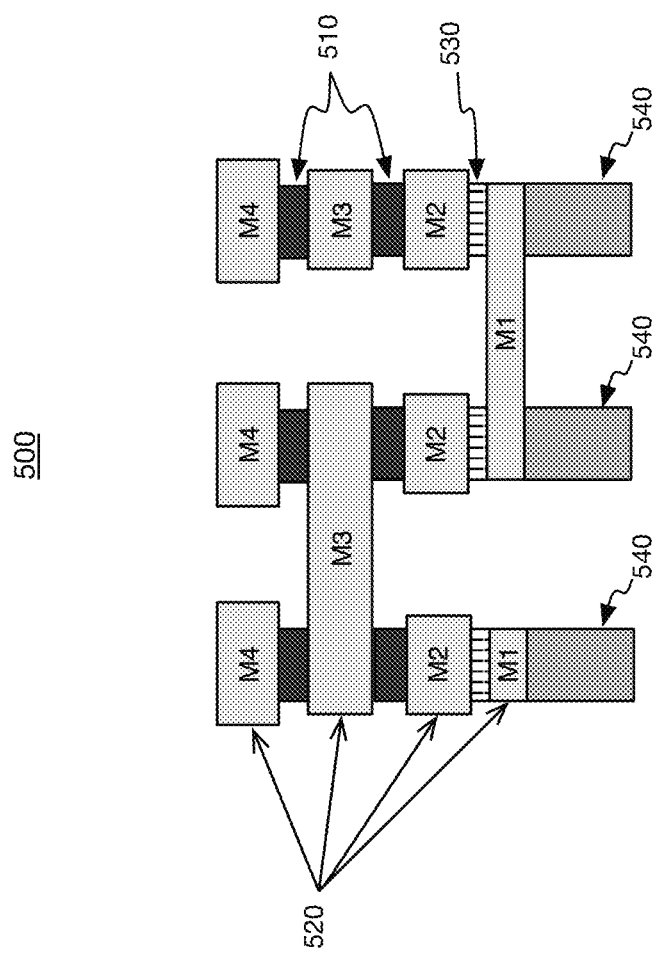
FIG. 5 is an illustration depicting a cross-sectional view of a portion of an example integrated circuit including a plurality of correlated electron switches positioned at multiple levels of a programmable fabric, in accordance with an embodiment.

FIG. 5 is a cross-sectional view of a portion of an example embodiment 500 of an integrated circuit. In an embodiment, an integrated circuit, such as integrated circuit 500, may include a number of connectors 540 that may electrically couple transistors in a substrate (not shown) to a metallization layer 520, such as metal layer M1. Additionally, in an embodiment, a number of electrically conductive vias, such as vias 530, may provide electrically conductive pathways between metallization layers 520, such as between metal layers M1 and M2, for example. Example integrated circuit 500 also may include a plurality of CES devices, such as CES devices 510, positioned at multiple levels of integrated circuit 500, in an embodiment. For example, a number of CES devices, such as CES devices 510, may be positioned between metal layers M2 and M3, and also between metal layers M3 and M4. In an embodiment, metal layers M2, M3, and M4, along with CES devices 520, may comprise a programmable fabric. In such a programmable fabric, individual CES devices, such as CES devices 510, may be programmed to place the CES device into at least one of a plurality of impedance states. For example, some CES devices of the programmable fabric may be placed in a higher impedance state, and other CES devices of the programmable fabric may be placed in a lower impedance state, in an embodiment. Also, the programming of the various CES devices, such as CES devices 520, may be changed through further programming operations.

In an embodiment, structures of example integrated circuit 500 positioned below metal layer M2, including metal layer M1 and connectors 540, may be dynamically re-wired at least in part through altering the impedance states of one or more of CES devices 510. Potential applications for such dynamic re-wiring ability may include, for example, compensating for manufacturing and/or design errors. Also, dynamic re-wiring through the alteration of impedance states of one or more of CES devices, such as CES devices 510, may allow for power gating. For example, portions of an integrated circuit may be disconnected by transitioning one or more CES devices to an insulative/higher-impedance state, and power consumption may be reduced, in an embodiment.

Together, FIGS. 4a-4d and FIG. 5 demonstrate that for one or more embodiments CES devices, such as CES devices 420 and/or 520, may be integrated into any layer in the MOL and/or BEOL of an integrated circuit, and that any particular CES device may be individually programmed to one of a plurality of impedance states. Thus, an integrated circuit, such as integrated circuits 400-403 and/or 500, may be reconfigured according to how the various CES devices are programmed.

Although example integrated circuits 400-403 and/or 500 depict particular configurations of layers and/or CES devices, claimed subject matter is not limited in scope to these particular examples. The concepts described in these example embodiments related to CES devices being integrated into any layer in the MOL and/or BEOL of an integrated circuit and/or of being individually programmable may be applied to a wide range of integrated circuit types and/or configurations.

Figure 6:
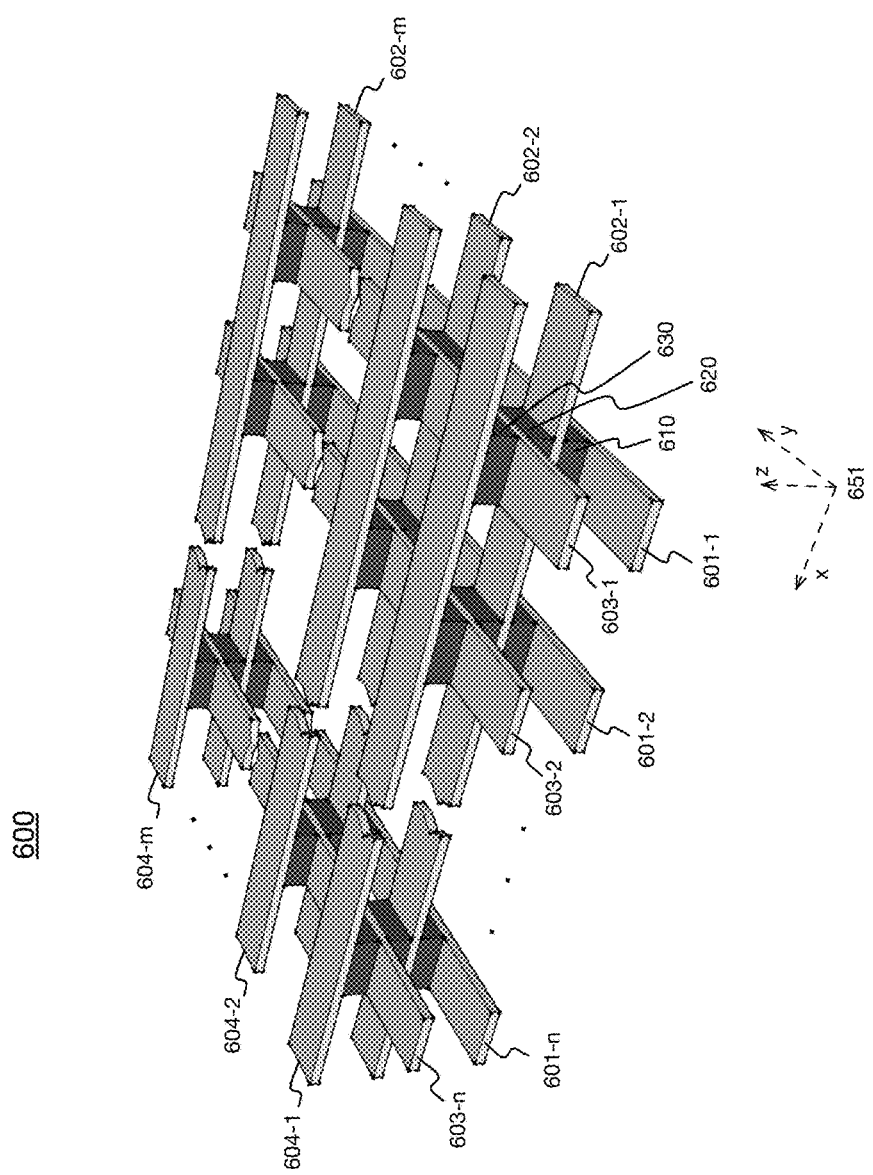
FIG. 6 depicts an example programmable fabric including a cross-point array of correlated electron switch devices, in accordance with an embodiment.

FIG. 6 depicts a perspective view of an example embodiment 600 of a programmable fabric including a cross-point array of CES devices, such as CES devices 610, 620, and 630. In this example, programmable fabric 600 may comprise a cross-point array including CES devices, such as CES devices 610, 620, and 630, positioned at intersections of a first set of electrically conductive lines 601-1, 601-2, . . . , 601-n and a second set of electrically conductive lines 602-1, 602-2, . . . , 602-m. Coordinate axis 651 indicates that the electrically conductive lines 601-1, 601-2, . . . , 601-n may be oriented in an y-direction and the electrically conductive lines 602-1, 602-2, . . . , 602-m may be oriented in a x-direction, in this example. As illustrated, electrically conductive lines 601-1, 601-2, . . . , 601-n may be substantially parallel to each other and may be substantially orthogonal to electrically conductive lines 602-1, 602-2, . . . , 602-m, however, embodiments are not so limited. As used herein, the term "substantially" intends that the modified characteristic needs not be absolute, but is close enough so as to achieve the advantages of the characteristic. For example, "substantially parallel" is not limited to absolute parallelism, and may include orientations that are at least closer to a parallel orientation than a perpendicular orientation. Similarly, "substantially orthogonal" is may include orientations that are at least closer to a perpendicular orientation than a parallel orientation.

Example programmable array 600 may also include a third set of electrically conductive lines 603-1, 603-2, ..., 603-n and a fourth set of electrically conductive lines 604-1, 604-2, ..., 604-m. In an embodiment, electrically conductive lines 603-1, 603-2, ..., 603-n may be substantially parallel to each other and may be substantially orthogonal to electrically conductive lines 604-1, 604-2, ..., 604-m. Of course, although this particular example may include four metallization layers, the scope of claimed subject matter is not so limited. For example, other embodiments may include fewer than four metallization layers, and still other embodiments may include more than four metallization layers.

In an embodiment, CES devices, such as CES devices 610, 620, and/or 630, may be individually programmed to one or more impedance states. For example, CES devices 610, 620, and/or 630 may be placed in either a conductive/lower impedance state or an insulative/higher impedance state. In an embodiment, a CES device, such as CES device 610, may be programmed at least in part by applying a programming voltage across electrically conductive line 602-1 and electrically conductive line 601-1. A voltage and/or current source may also apply sufficient current at the programming voltage by way of electrically conductive line 602-1 and electrically conductive line 601-1 to ensure that a set or reset condition is reached, depending on the desired impedance state for CES device 610. For example, to program CES device 610 to an insulative/higher impedance state, sufficient voltage and/or current may be applied to CES device 610 by way of electrically conductive lines 601-1 and 602-1 to achieve a reset condition. Similarly, to program CES device 610 to a conductive/lower impedance state, sufficient voltage and/or current may be applied to CES device 610 by way of electrically conductive lines 601-1 and 602-1 to achieve a set condition. CES device 620 may be programmed in a similar manner by applying a programming voltage and/or current to CES device 620 by way of electrically conductive lines 602-1 and 603-1, for example. Likewise, CES device 630 may be programmed by applying a programming voltage and/or current by way of electrically conductive lines 603-1 and 604-1.

Through appropriate selection of electrically conductive lines, any of the CES devices of programmable fabric 600 may be individually programmed. Because CES devices, such as CES devices 610, 620, and/or 630, of a programmable fabric, such as programmable fabric 600, of an integrated circuit may be individually programmed, any of a wide range of circuit configurations may be attained. For example, by transitioning CES devices between lower and higher impedance states, and because CES devices are non-volatile, CES devices positioned at intersections of electrically conductive lines in a programmable fabric may be used to open and/or close portions of a circuit. Potential applications for such functionality are numerous. For example, field-programmable gate array (FPGA) and/or dynamically changeable application specific integrate circuit (ASIC) type functionalities may be achieved, in an embodiment.

Also, circuitry may be reconfigured after being manufactured utilizing a programmable fabric, such as programmable fabric 600, in an embodiment. For example, a fabric comprising multiple metal layers and a plurality of CES devices may be implemented such that arbitrary nets in an integrated circuit may be joined together depending on how the plurality of CES devices of the fabric are programmed. This functionally may allow for fixing catastrophic errors during a manufacturing and/or design process, and/or for fixing clock skew issues that may negatively affect yield. For example, clock skew may be adjusted in an embodiment by re-programming one or more CES devices of a programmable fabric, such as programmable fabric 600, for example. Of course, these are merely example applications for a programmable CES fabric, and claimed subject matter is not limited in scope in these respects.

In an embodiment, example programmable fabric 600 depicted may comprise a cross-point memory array. Individual CES devices, such as CES devices 610, 620, and/or 630, may individually comprise memory cells. In an embodiment, a CES device programmed to a conductive/lower impedance state may represent a bit value of "1", and a CES device programmed to an insulative/higher impedance state may represent a bit value of "0", in an embodiment. CES devices, such as CES devices 610, 620, and/or 630, may be individually programmed, and/or may be individually read, in an embodiment. Further, in an embodiment, electrically conductive lines 601-1, 601-2, ..., 601-n, may comprise bit lines, and electrically conductive lines 602-1, 602-2, ..., 602-n, may comprise word lines. Additionally, in an embodiment, electrically conductive lines 603-1, 603-2, ..., 603-n, may also comprise bit lines, and electrically conductive lines 604-1, 604-2, ..., 604-n, may comprise word lines. Individual CES memory cells may be accessed through selection of an appropriate bit line and word line. In an embodiment, multiple CES memory cells may be accessed concurrently, such as for programming and/or reading.

Figure 7:
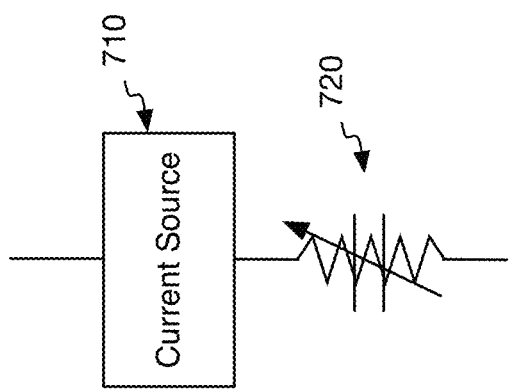
FIG. 7 depicts a schematic diagram of an example compound device, in accordance with an embodiment.

FIG. 7 depicts a schematic diagram of an embodiment 700 of an example compound device. As utilized herein, the term "compound device" refers to a CES, such as CES 720, coupled to a current and/or voltage source, such as current source 710. In an embodiment, compound device behavior may be defined, at least in part, by how a CES, such as CES 720, behaves when coupled to an external current and/or voltage source, such as current source 710. Example current sources may include, but are not limited to, a diode and/or a transistor, in an embodiment. As described above, a CES, such as CES 720, may require both critical voltage and critical current conditions to achieve a set condition and/or to achieve a reset condition. In an embodiment, set and reset conditions comprise unique physical actions. For example, set and/or reset conditions individually require particular carrier densities (i.e., to meet the Mott criteria) and an applied bias to inject holes and/or electrons into the CEM of a CES device. Therefore, a CES, such as CES 720, may exhibit different, distinct characteristics when coupled with different current and/or voltage sources, such as current source 710, in an embodiment. Thus, coupling a CES, such as CES 720, to different current and/or voltage sources, such as current source 710, may yield different compound devices exhibiting characteristics that depend, at least in part, on the particular current and/or voltage source. As a CES requires both a critical voltage and current (as opposed to a one or the other) to transition from one impedance state to another, compound device behavior can varying widely, depending at least in part on the characteristics of the current/voltage source. That compound device behavior may depend, at least in part, on the particular current and/or voltage source coupled to a CES may be understood through examination of the following Kirchhoff Current Law equations, represented by expressions (6) below:

$$J_{CEM}(V_{CEM}) = J_{critical}(V_{critical}) = J_{reset}(V_{reset}) \text{ or } J_{set}(V_{set}) \qquad (6)$$

$$J_{CEM}(V_{CEM}) = \sigma E_{CEM}(V_{CEM}) = \frac{I_{source}(V_{source})}{A_{CEM}}$$

$$E_{CEM}(V_{CEM}) \sim \frac{(V_{CEM})}{d_{CEM}}$$

$$J_{CEM}(V_{CEM}) = \sigma \frac{V_{CEM}(V_{CEM})}{d_{CEM}} = \frac{I_{source}(V_{source})}{A_{CEM}}$$

$$I_{source}(V_{source}) = J_{CEM}(V_{CEM})A_{CEM} = \frac{A_{CEM}}{d_{CEM}} \sigma V_{CEM}$$

wherein σ represents CEM conductivity, $A_{CEM}$ represents an area of a CEM of a CES device, and $d_{CEM}$ represents a depth or thickness of the CEM of the CES device.

From expressions (6) above, it may be seen that criteria for switching from a conductive/lower impedance state to an insulative/higher impedance state or from an insulative/higher impedance state to a conductive/lower impedance state for a CES may be determined at least in part by CEM design. In an embodiment, CEM material composition and/or dimensions may affect switching criteria. For example, an increase in CEM area may result in an increase in critical current ($I_{critical}$) and/or critical voltage ($V_{critical}$), in an embodiment. Similarly, current through a CES, such as CES 720, may depend at least in part on the particular characteristics of the current and/or voltage supply, such as current source 710, due at least in part to the duel dependency of critical voltage and critical current for switching. Also, in an embodiment, a Mott transition inside a CEM of a CES, such as CES 720, may be controlled and/or determined via one or more characteristics of a particular current and/or voltage source, such as current source 710.

Figure 8:
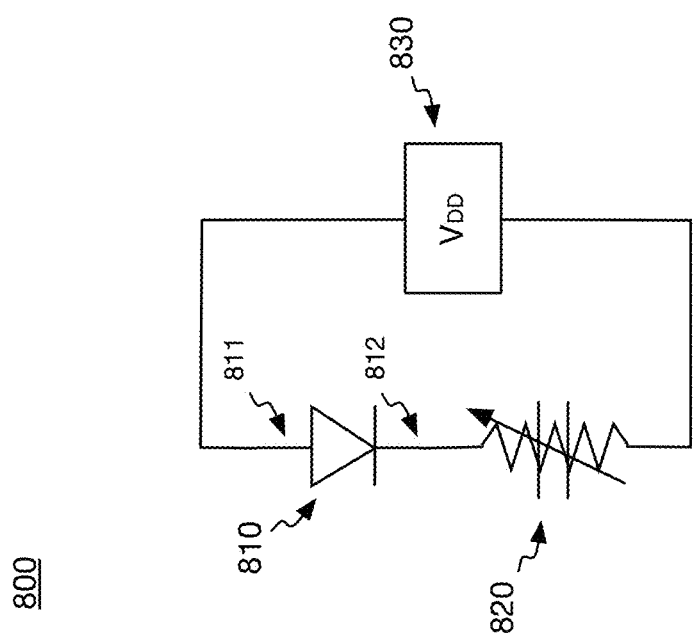
FIG. 8 depicts a schematic diagram of an example compound device comprising a diode, in accordance with an embodiment.

FIG. 8 is a schematic diagram depicting an embodiment 800 of an example compound device comprising a CES device, such as CES 820, coupled to a diode, such as diode 810. In an embodiment, diode 810 may comprise a current and/or voltage source, along with a voltage, such as $V_{DD}$ 830, applied across both diode 810 and CES 820. Characteristics of behavior for a compound device, such as compound device 800, comprising a diode, such as diode 810, may be described by expression (7), below.

$$I_{diode}(V_{CE}, t) = I_0 \left( e^{\frac{V_{CE}}{nV_t}} - 1 \right) \qquad (7)$$

$$I_{diode}(V_{CE}, t) = \frac{A_{CEM}}{d_{CEM}} \sigma V_{CEM}$$

$$V_{CEM} = V_{DD} - V_{ce} = V_{DD} - I_{diode} R_{diode}$$

wherein $V_{ce}$ represents a voltage across terminals, such as terminals 811 and 812, of a diode, such as diode 810.

Figure 9:
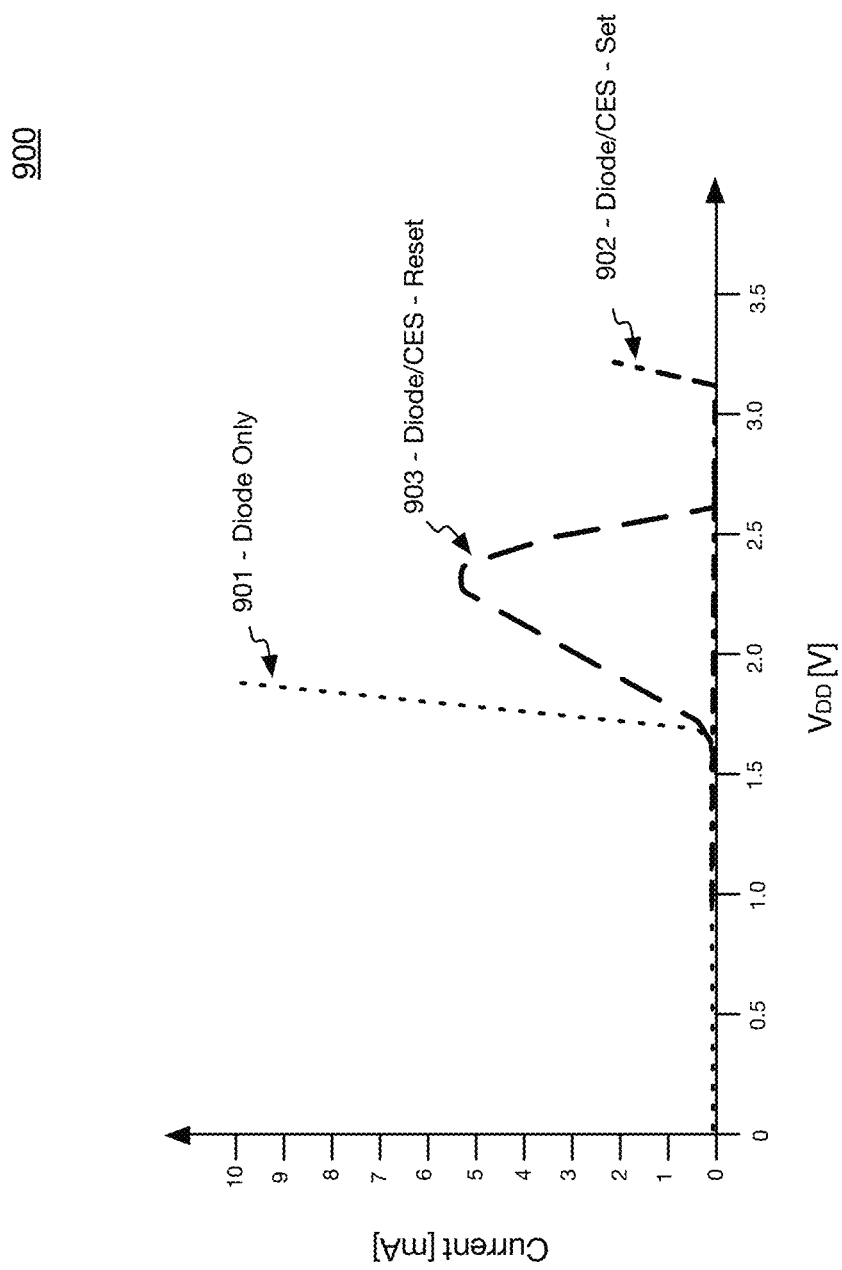
FIG. 9 shows an example plot depicting example current vs. voltage curves representative of data collected for an example compound device including a diode, in accordance with an embodiment.

FIG. 9 depicts an example plot 900 including an example current vs. voltage curve 902 representative of data collected for an example set condition and an example curve 903 representative of data collected for an example reset condition. Example curve 901 depicts example current vs. voltage data for a diode-only, such as may be observed across terminals 811 and 812 of diode 810 of example compound device 800, for example. As depicted in example plot 900, utilization of a diode, such as diode 810, as a current and/or voltage source for a compound device, such as compound device 800, results in a shifting of both Diode/CES—Reset 1103 ($V_{reset}$) and Diode/CES—Set ($V_{set}$) due to a voltage drop across the diode. For example, a diode, such as diode 810, needs to turn on before a critical voltage can be developed across a CES device, such as CES 820, and before a critical current can be developed so that switching can occur.

As mentioned previously, for a compound device, such as compound device 800, a CES device, such as CES 820, may adopt characteristic behavior of a current and/or voltage source, such as diode 810, in an embodiment. In an embodiment, current through a CES device, such as CES 820, may be dependent on a voltage, such as $V_{ce}$, across terminals, such as terminals 811 and 812, of a diode, such as diode 810. In an embodiment, a voltage, such as $V_{ce}$, across terminals, such as terminals 811 and 812, of a diode, such as diode 810, may set a critical voltage and critical current for a compound device, such as compound device 800. Expression (8) below represents a special case of expression (7) when a is relatively large, such as when a CEM is placed in a conductive/lower impedance state.

$$I_{diode}(V_{ce}) \sim \frac{V_{DD}}{R_{diode}(V_{ce})} \qquad (8)$$

Expression (9) below represents a special case of expression (7) when σ is relatively small, such as when a CEM is placed in an insulative/higher impedance state.

$$I_{diode}(V_{ce}) \sim \frac{A_{CEM}}{d_{CEM}} \sigma V_{DD} \qquad (9)$$

For situations in which a is relatively large, such as when a CEM of a CES device is placed in a conductive/lower impedance state, a current through a CES device, such as CES 820, may be dominated by the diode, such as diode 810. For situations in which a is relatively small, such as when a CEM of a CES device, such as CES 820, is placed in an insulative/higher impedance state, the current through the CES device, such as CES 820, may be determined mainly by the resistance of a diode, such as diode 810.

Figure 10:
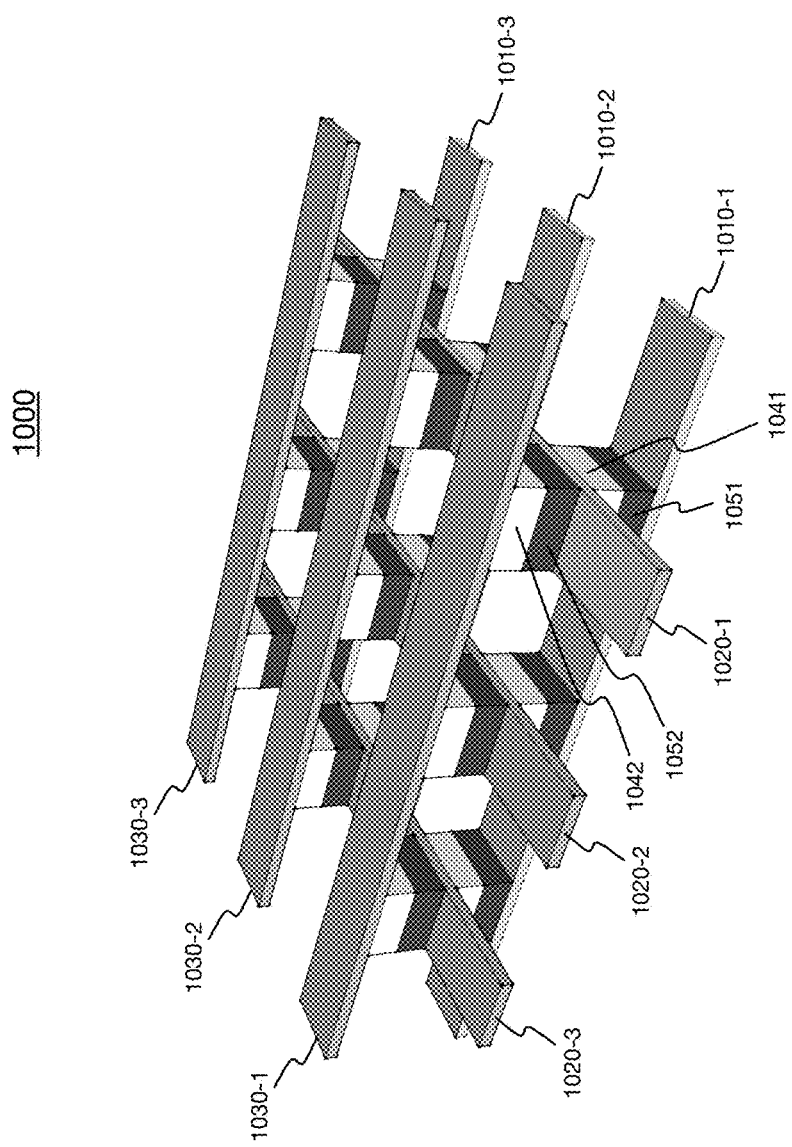
FIG. 10 depicts an example programmable fabric including a cross-point array of correlated electron switch devices, in accordance with an embodiment.

FIG. 10 depicts an embodiment 1000 of an example programmable fabric including a cross-point array of CES devices, such as CES devices 1051 and 1052. In an embodiment, a programmable fabric, such as programmable fabric 1000, may comprise a cross-point CES memory array. In an embodiment, electrically conductive lines 1010-1, 1010-2, and 1010-3 may be positioned substantially parallel with each other. Similarly, electrically conductive lines 1020-1, 1020-2, and 1020-3 may be positioned substantially parallel with each other, and electrically conductive lines 1030-1, 1030-2, and 1030-3 may be positioned substantially parallel with each other. Also, in an embodiment, electrically conductive lines 1010 may be positioned substantially orthogonally with conductive lines 1020. Electrically conductive lines 1030 may also be positioned substantially orthogonally with electrically conductive lines 1020.

CES devices, such as CES devices 1051 and 1052, may be combined with access devices, such as diodes 1041 and 1042, to form CES/access device pairs that may operate as memory cells, in an embodiment. In an embodiment, access devices, such as diodes 1041 and/or 1042, may help reduce leakage current due to a characteristic that sufficient voltage to cause current flow through the diode must be achieved before a voltage can be applied to respective CES devices, such as CES devices 1051 and/or 1052. As mentioned above, access devices, such as diodes 1041 and/or 1042 paired with respective CES devices, such CES devices 1051 and/or 1052, may be referred to as offset diodes. In an embodiment, access devices, such as diodes 1041 and/or 1042, may comprise schottky diodes, although claimed subject matter is not limited in scope in this respect.

In an embodiment, a cross-point memory array, such as cross-point CES memory array 1000, may comprise a fully addressable three-dimensional CES memory array. In an embodiment, individual bit locations may be specified according to an address comprising x, y, and z components, for example. In an embodiment, at individual intersections of electrically conductive lines, a CES device, such as CES device 1051, may be paired with an access device, such as diode 1041. For example, CES/access device pairs may be positioned at intersections of electrically conductive lines 1010-1, 1010-2, 1010-3 and electrically conductive lines 1020-1, 1020-2, 1020-3, and at intersections of electrically conductive lines 1020-1, 1020-2, 1020-3 and electrically conductive lines 1030-1, 1030-2, 1030-3. Also, in an embodiment, electrically conductive lines 1020-1, 1020-2, 1020-3 may comprise word lines. Electrically conductive lines 1010-1, 1010-2, 1010-3 and electrically conductive lines 1030-1, 1030-2, 1030-3 may comprise bit lines, in an embodiment.

Although example cross-point CES memory array 1000 is depicted as comprising three metal layers, including electrically conductive lines 1010, 1020, and 1030, other embodiments may comprise fewer metal layers or greater metal layers. Individual metal layers may include any number of electrically conductive lines, in one or more embodiments. Cross-point CES memory arrays, such as cross-point CES memory array 1000, may be scaled to a desired storage capacity at least in part by adjusting a number of electrically conductive lines for individual metal layers and/or by adjusting a number of layers of electrically conductive lines and/or CES devices, for example.

In an embodiment, a CES memory cell may comprise one or more memory elements (e.g., non-volatile memory elements) comprising a CES device, such as CES 1051. In this context, a "memory cell" as referred to herein comprises a circuit or portion of a circuit capable of representing a value, symbol or parameter as a state. For example, a memory cell may comprise one or more CES memory devices that are capable of representing a value, symbol or parameter as an impedance state of the CES memory device. For example, a memory element, such as CES 1051, may be placed in a particular memory state (e.g., a lower impedance state or higher impedance state) by independently controlling voltage and current applied across electrically conductive lines 1020-1 and 1010-1 in a "write operation." In an embodiment, such a write operation may be executed by application of a signal which is controlled to provide a critical current and voltage across CES 1051 to place CES 1051 in a particular impedance state. In another aspect, an impedance state of a memory element, such as CES 1051, may be detected or sensed in a "read operation" by applying a read voltage across electrically conductive lines 1020-1 and 1010-1. In an embodiment, a sense circuit (not shown) may detect an impedance state of CES 1051 based at least in part on a magnitude of current from bit line 1010-1 in a read operation. An output signal may have a voltage that is indicative of a current impedance state of CES device 1051 (e.g., as a "1," "0" or other symbol), in an embodiment. Of course, claimed subject matter is not limited in scope in these respects.

In one or more embodiments wherein a CES device is utilized, at least in part, as a memory cell and/or circuitry associated with a memory cell, advantages may be realized as compared to memory circuits incorporating conventional and/or prior memory technologies. For example, as a result of improved device reliability and/or improved endurance, needs for wear-leveling and/or error correcting circuitry may be reduced, and costs may also be reduced. Additionally, because a wide range of metal and/or conductive materials that may be used to form contacts in a CES device, ease of manufacture may be greatly improved. Further, in an embodiment, processing temperatures may relatively low, making CES devices easier to process. Also, performance for a CES device may be extremely quick as compared to prior and/or conventional memory technologies due to switch events occurring in distances less than a Thomas Fermi screening length, for example. Additionally, the lack of a filament such as may be formed in some resistive memory technologies may lead to improved performance and/or reliability. Of course, these are merely example advantages that a CES device may have over prior and/or conventional memory technologies, and claimed subject matter is not limited in scope in these respects.

Figure 11:
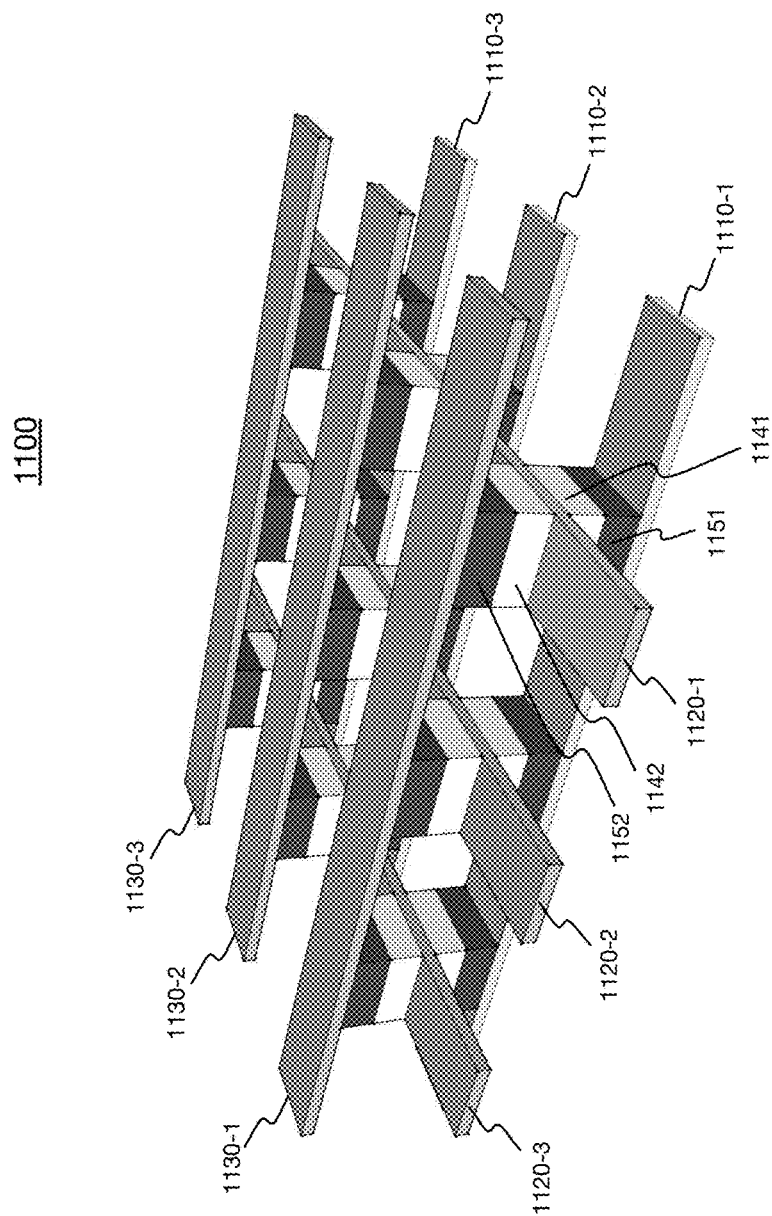
FIG. 11 depicts an example programmable fabric including a cross-point array of correlated electron switch devices, in accordance with an embodiment.

FIG. 11 depicts an embodiment 1100 of an example programmable fabric including a cross-point array of CES devices, such as CES devices 1151 and 1152. In an embodiment, cross-point array 1100 may comprise a cross-point CES memory array. Example cross-point CES memory array 1100 may have some elements in common with example array 1000, discussed above. For example, several layers of electrically conductive lines are provided, such as electrically conductive lines 1110, 1120, and 1130. In an embodiment, electrically conductive lines 1110-1, 1110-2, and 1110-3 may be positioned substantially parallel with each other. Similarly, electrically conductive lines 1120-1, 1120-2, and 1120-3 may be positioned substantially parallel with each other, and electrically conductive lines 1130-1, 1130-2, and 1130-3 may be positioned substantially parallel with each other. Also, in an embodiment, electrically conductive lines 1110 may be positioned substantially orthogonally with conductive lines 1120. Electrically conductive lines 1130 may also be positioned substantially orthogonally with electrically conductive lines 1120. Also, in an embodiment, electrically conductive lines 1120 may comprise word lines. Electrically conductive lines 1110 and 1130 may comprise bit lines, in an embodiment.

Also, similar to example cross-point CES memory array 1000 described above, CES/access point pairs of example array 1100 may be positioned at intersections of electrically conductive lines 1110-1, 1110-2, 1110-3 and electrically conductive lines 1120-1, 1120-2, 1120-3, and at intersections of electrically conductive lines 1120-1, 1120-2, 1120-3 and electrically conductive lines 1130-1, 1130-2, 1130-3. However, for example cross-point CES memory array 1100, CES/access device stacks may be oriented such that a single electrically conductive line, such as a word line 1120-1, may control access to two CES devices, such as CES devices 1151 and 1152, in association with a pair of bit lines, such as electrically conductive lines 1110-1 and 1130-1, for example. Thus, an application of a programming and/or read signal to word line 1120-1 together with selections of bit lines 1110-1 and 1130-1 may provide programming and/or read access to CES devices 1151 and 1152, in an embodiment.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. An apparatus, comprising: a programmable fabric comprising:
    a plurality of metallization layers; and
    a first plurality of correlated electron switch devices to be positioned between a first metallization layer of the plurality of metallization layers and a second metallization layer of the plurality of metallization layers, and a second plurality of correlated electron switch devices to be positioned between the second metallization layer and a third metallization layer of the plurality of metallization layers, wherein the first and second pluralities of correlated electron switch devices are programmable to selectively open or close one or more of a plurality of conductive paths between one or more of a first plurality of electrically conductive lines formed on the first metallization layer and one or more of a second plurality of electrically conductive lines formed on the third metallization layer, and wherein opening or closing the one or more of the plurality of conductive paths connects or disconnects portions of an integrated circuit.

2. The apparatus of claim 1, wherein the programmable fabric further comprising a cross-point array, wherein the first plurality of electrically conductive lines are oriented approximately parallel with each other, wherein the second electrically conductive lines are oriented approximately parallel with each other, and wherein the first electrically conductive lines are oriented approximately orthogonally to the second electrically conductive lines.

3. The apparatus of claim 2, wherein one or more of the first plurality of correlated electron switch devices are to be individually positioned at one or more intersections of the first electrically conductive lines and the second electrically conductive lines of the second metallization layer.

4. The apparatus of claim 3, wherein the programmable fabric further to comprise one or more access devices to be respectively positioned at the one or more intersections of the first electrically conductive lines and the second electrically conductive lines.

5. The apparatus of claim 4, wherein the one or more access devices to comprise schottky diodes.

6. The apparatus of claim 3, further comprising a voltage and/or current source, wherein to transition a particular correlated electron switch device of the first plurality of correlated electron switch devices from a first impedance state to a second impedance state, the voltage and/or current source to apply a programming voltage across a particular electrically conductive line of a particular metallization layer and a particular electrically conductive line of another particular metallization layer.

7. The apparatus of claim 1, wherein one or more of the first and second pluralities of correlated electron switch devices to have particular programmable impedance characteristics to include particular programmable resistance and capacitance characteristics.

8. A memory device, comprising:
    a plurality of correlated electron switch devices to be positioned within a three-dimensional cross-point array, wherein the three-dimensional cross-point array to comprise a plurality of layers of electrically conductive lines including a first layer, a second layer, and a third layer, wherein one or more of the plurality of correlated electron switch devices are to be positioned between the first and second layers of the electrically conductive lines and wherein another one or more of the plurality of correlated electron switch devices are to be positioned between the second and third layers of the electrically conductive lines to provide a plurality of programmable electrically conductive paths between the plurality of layers of electrically conductive lines and one or more other of the plurality of layers of electrically conductive lines, wherein one or more of the plurality of correlated electron switch devices to have particular programmable impedance characteristics to include particular programmable resistance and capacitance characteristics.

9. The memory device of claim 8, wherein one or more of the plurality of correlated electron switch devices are to be individually positioned at one or more intersections of approximately orthogonally positioned electrically conductive lines.

10. The memory device of claim 9, wherein the plurality of correlated electron switch devices are to be individually addressable within the three-dimensional cross-point array through selection of a particular pair of approximately orthogonally positioned electrically conductive lines.

11. The memory device of claim 9, further comprising a voltage and/or current source, wherein the approximately orthogonally positioned electrically conductive lines to comprise a plurality of bit lines and at least one word line.

12. The memory device of claim 11, wherein to program a particular correlated electron switch device within the three-dimensional cross-point array, the voltage and/or current source to apply a programming voltage across a particular word line and a particular bit line.

13. The memory device of claim 11, wherein to detect an impedance state of a specified plurality of correlated electron switch devices within the three-dimensional cross-point array, the voltage and/or current source to apply a read voltage across one or more specified word lines and a plurality of specified bit lines.

14. The memory device of claim 8, further comprising one or more access devices to be positioned with one or more respective correlated electron switch devices at one or more intersections of the approximately orthogonally positioned electrically conductive lines.

* * * * *